United States Patent
Yoshida

[19]

[11] Patent Number: 6,051,885
[45] Date of Patent: Apr. 18, 2000

[54] SEMICONDUCTOR DEVICE HAVING A CONDUCTOR WITH A WEDGE SHAPED DEPRESSION

[75] Inventor: Seiko Yoshida, Yokohama, Japan

[73] Assignee: Kabushiki Kaisha Toshiba, Kawasaki, Japan

[21] Appl. No.: 09/123,843

[22] Filed: Jul. 28, 1998

[30] Foreign Application Priority Data

Jul. 29, 1997  [JP]  Japan .................................... 9-203010

[51] Int. Cl.[7] .......................... H01L 23/48; H01L 23/52; H01L 29/40
[52] U.S. Cl. .......................... 257/775; 257/773; 257/774; 257/750; 257/758; 257/510; 257/296; 257/249
[58] Field of Search ..................... 257/775, 774, 257/773, 296, 401, 249, 750, 758, 510

[56] References Cited

U.S. PATENT DOCUMENTS

| | | | |
|---|---|---|---|
| 5,561,307 | 10/1996 | Mihara et al. ........................... | 257/295 |
| 5,699,291 | 12/1997 | Tsunemine ............................... | 365/149 |
| 5,811,331 | 9/1998 | Ying et al. ............................... | 438/253 |

FOREIGN PATENT DOCUMENTS 55-113344  1/1980  Japan .............................. H01L 21/88

*Primary Examiner*—Mahshid Saadat
*Assistant Examiner*—Matthew Warren
*Attorney, Agent, or Firm*—Loeb & Loeb, LLP

[57] ABSTRACT

A highly integrated semiconductor device is made using a high precision manufacturing process having a comparatively small number of process steps. The device is substantially free of misalignment between structures formed with respect to openings formed in the middle of layers. An interlayer insulating film with an opening is formed on a first conductor, and a second conductor is deposited on the resultant structure. Part of the second conductor enters the opening, thereby producing a depression in the second conductor, which has a sharp-angled bottom situated at the horizontal center of the opening. A film made of, for example, a nitride is deposited on the second conductor to fill the depression. Thereafter, this film is removed such that part of it remains in the depression. Using the remaining film as a mask, the second conductor is removed to the same level as the interlayer insulting film. Then, the remaining film is removed, and a dielectric and a third conductor are formed on the second conductor and the interlayer insulating film.

12 Claims, 10 Drawing Sheets

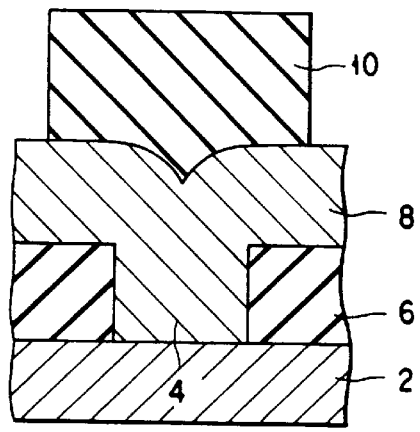
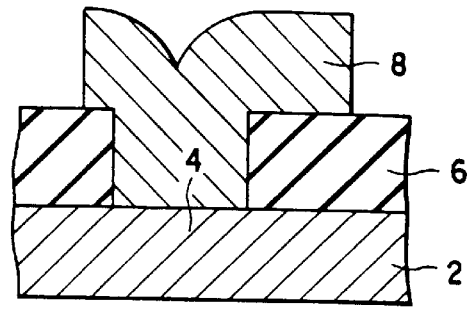
FIG. 1 (PRIOR ART)
FIG. 2 (PRIOR ART)
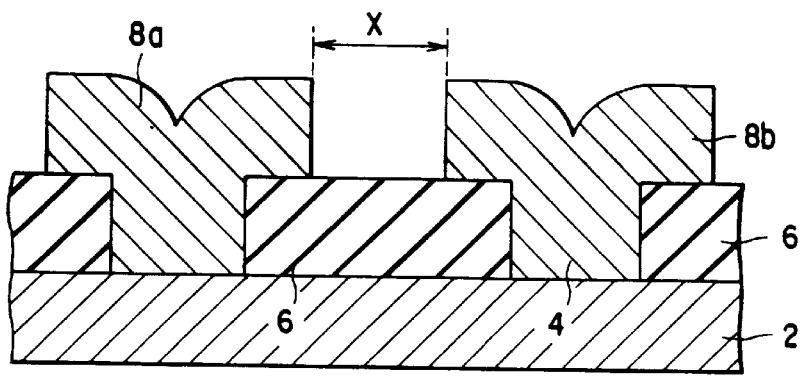
FIG. 3 (PRIOR ART)

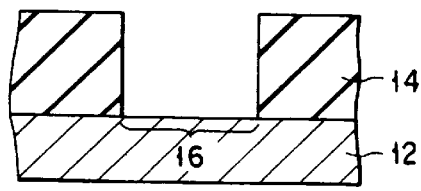
FIG. 4A
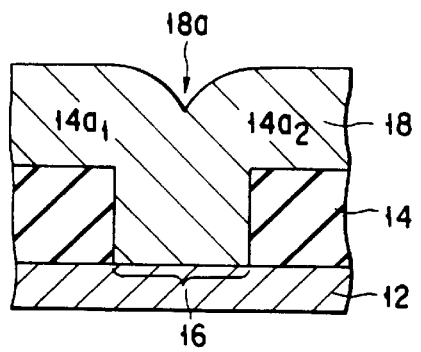
FIG. 4B
FIG. 4C
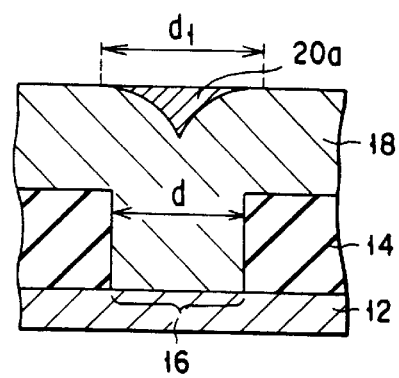
FIG. 4D
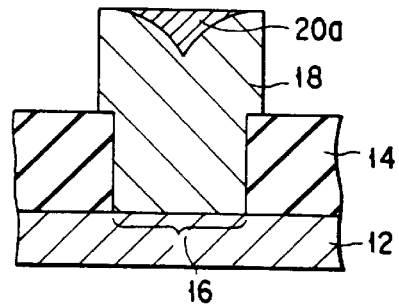
FIG. 4E
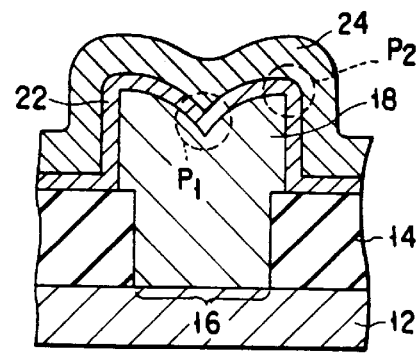
FIG. 4F

SEMICONDUCTOR DEVICE HAVING A CONDUCTOR WITH A WEDGE SHAPED DEPRESSION

BACKGROUND OF THE INVENTION

This invention relates to a semiconductor device and a method for manufacturing the device, and more particularly to a semiconductor device used as wiring or a stacked capacitor.

Semiconductor devices used as wiring or stacked capacitors have been being developed. To form such wiring or the lower electrode of a capacitor, for example, an interlayer insulating film 6 having an opening 4 is formed on a conductor 2, and a conductor 8 which will serve as wiring or the lower electrode of the capacitor is deposited on the resultant structure, as is shown in FIG. 1. Thereafter, a resist pattern 10 is formed on the conductor 8. Using the resist pattern 10 as a mask, the conductor 8 is etched.

During the manufacture of the semiconductor device of the FIG. 1 structure, it is possible that the pattern 8 will not be aligned with the interlayer insulating film 6 because of the opening 4 as shown in FIG. 2. In light of this, a margin for compensating such a misalignment is required, which inevitably degrades the precision of the film forming process.

Moreover, to form a highly integrated structure in which wiring layers or capacitors are formed very closely as, in particular, in the case of a memory cell, the distance between the lower electrodes 8a and 8b of the adjacent wiring layers or capacitors cannot be reduced to a value lower than the minimum value (=x in the FIG. 3 case) which is achieved in lithography.

In addition, the use of lithography inevitably increases the process steps.

BRIEF SUMMARY OF THE INVENTION

It is the object of the invention to provide a semiconductor device of high precision and integration, which is free from misalignment of layers due to openings formed in a middle one of the layers, and can be manufactured by a small number of process steps, and also to provide a method for manufacturing the semiconductor device.

According to an aspect of the invention, there is provided a method of manufacturing a semiconductor device, comprising: the first step of forming an opening in an insulating film; the second step of depositing a first conductor on the insulating film and in the opening such that a depression is formed above the opening; the third step of forming a predetermined film in the depression; and the fourth step of removing the first conductor using, as a mask, the predetermined film in the depression.

According to another aspect of the invention, there is provided a semiconductor device comprising: a first insulating film with an opening; and a first conductor extending from the bottom of the opening to a predetermined distance from the edge of the opening, and having a depression above the opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a sectional view, showing the structure of a conventional semiconductor device used as wiring or a stacked capacitor;

FIG. 2 is a sectional view, showing the structure of a conventional semiconductor device used as wiring or a stacked capacitor, and useful in explaining a case where layers are not aligned with each other due to an opening;

FIG. 3 is a sectional view, showing the structure of a conventional semiconductor device used as wiring or a stacked capacitor;

FIG. 4A is a sectional view, showing a process step for manufacturing a semiconductor device according to a first embodiment of the invention;

FIG. 4B is a sectional view, showing a process step for manufacturing a semiconductor device according to a first embodiment of the invention;

FIG. 4C is a sectional view, showing a process step for manufacturing a semiconductor device according to a first embodiment of the invention;

FIG. 4D is a sectional view, showing a process step for manufacturing a semiconductor device according to a first embodiment of the invention;

FIG. 4E is a sectional view, showing a process step for manufacturing a semiconductor device according to a first embodiment of the invention;

FIG. 4F is a sectional view, showing a process step for manufacturing a semiconductor device according to a first embodiment of the invention;

DETAILED DESCRIPTION OF THE INVENTION

Figure 5:
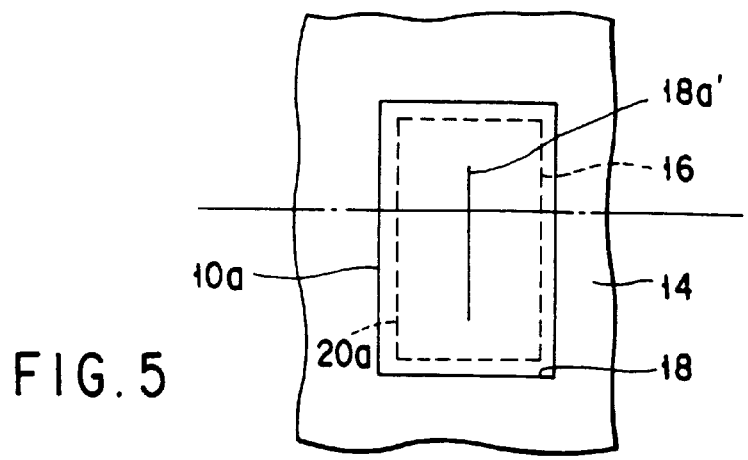
FIG. 5 is a plan view of the FIG. 4E structure.

The embodiments of the invention will be described with reference to the accompanying drawings.

Referring first to FIGS. 4A–4F and FIG. 5, a semiconductor device according to a first embodiment of the invention will be described. FIGS. 4A–4F are sectional views showing a process for manufacturing the semiconductor device of the first embodiment, and FIG. 5 a plan view of the FIG. 4E structure.

As is shown in FIG. 4A, an interlayer insulating film (such as an $SiO_2$ film) 14 is formed on a conductor 12. An opening 16 is formed in the film 14 by lithogrphy and etching to expose the conductor 12.

Then, as is shown in FIG. 4B, a conductor 18 is deposited on the interlayer insulating film 14 and on that portion of the conductor 12 which is exposed through the opening 16. At this time, a depression 18a appears above the opening 16. This depression is formed since part of the conductor 18 has fallen into the opening 16. Imagine, for example, a sectional structure of a portion indicated by the broken line shown in FIG. 5. In this case, the sharp-angled bottom 18a' of the depression 18a is formed at the same distance from the surface $14a_1$ of the interlayer insulating film 14 as from the surface $14a_2$ (the surfaces $14a_1$ and $14a_2$ are opposed to each other with respect to the opening 16). In other words, the bottom 18a' is situated at the center of the opening 16.

Subsequently, as shown in FIG. 4C, a film 20 such as a silicon nitride film is deposited on the conductor 18 such that it completely fills the depression 18a. In other words, it suffices if the film 20 is deposited to a thickness enough to fill the depression 18a.

As is shown in FIG. 4D, the film 20 on the conductor 18 is selectively removed by, for example, CMP such that a portion 20a thereof remains to cover the depression 18a.

Thereafter, as is shown in FIGS. 4E and 5, the conductor 18 is etched, for example, in an anisotropic manner, using the remaining portion 20a of the film 20 as a mask, until the interlayer insulating film 14 is exposed.

In the FIG. 4E structure, each side of the surface of the remaining portion 20a is set longer than a corresponding side of the opening 16. As shown in FIG. 4D, for example, the length $d_1$ of the remaining portion 20a is greater than the width d of the opening 16.

Thereafter, as shown in FIG. 4F, the remaining portion 20a of the film 20 is removed by etching. A dielectric 22 is formed on the conductor 18 with no film 20 and on the interlayer 16, and a conductor 24 is formed on the dielectric 22, thereby forming a capacitor.

Since thus, the conductor 18 as the lower electrode pattern of the capacitor is formed in a self-alignment manner with respect to a contact pattern (not shown) for the lower layer, misalignment of the lower electrode pattern and the contact pattern for the lower layer will not occur. As a result, the process precision of the capacitor is significantly enhanced.

Further, as shown in FIG. 5, the conductor 18 which will serve as the lower electrode has its corners rounded, electric field concentration at the corners of the electrode can be reduced, which means that the resultant capacitor has a high resistance against the voltage.

In addition, when a plurality of capacitors are formed adjacent to each other, the distance therebetween can be reduced to a value less than the minimum value which is achieved in lithography.

Figure 6A:
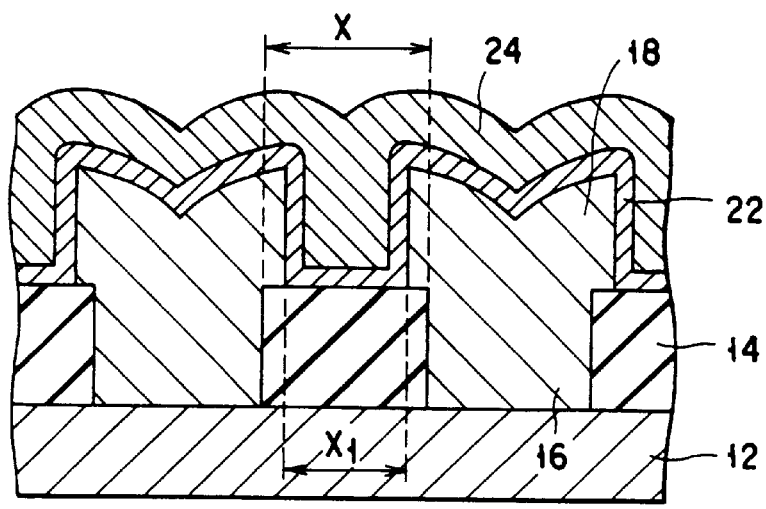
FIG. 6A is a sectional view, showing a modification of the semiconductor device of the first embodiment.
Figure 6B:
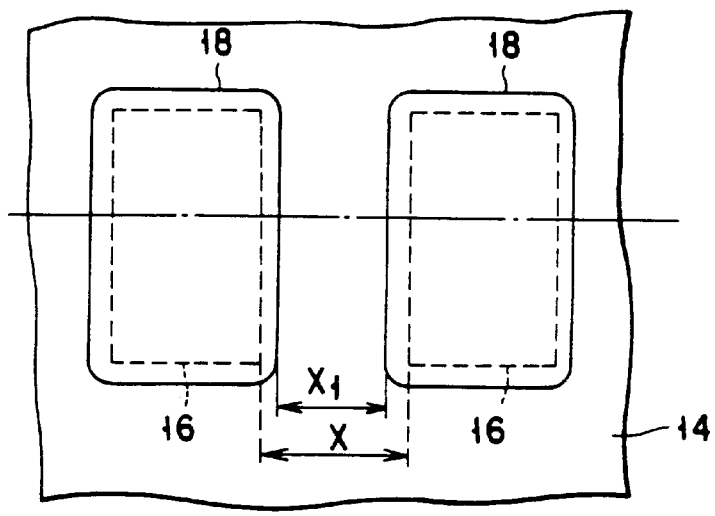
FIG. 6B is a plan view of a structure obtained by omitting part of the semiconductor device shown in FIG. 6A.

For example, the distance between adjacent capacitors formed by the process according to the first embodiment can be set at $x_1$, which is less than the minimum distance x achieved in lithography, as is shown in FIGS. 6A and 6B. This is especially useful in a case where a highly integrated fine structure such as a memory cell array must be formed.

Although FIG. 6B is a plan view of the FIG. 6A structure, the dielectric 22 and the conductor 24 are omitted therein to facilitate the explanation.

Moreover, since the lower electrode of the capacitor is formed without lithography, the semiconductor device is formed by a small number of process steps.

A second embodiment of the invention will now be described. In the following, elements similar to those in the first embodiment are denoted by corresponding reference numerals, and duplicate explanations will not be given.

Figures 7A, 7B:
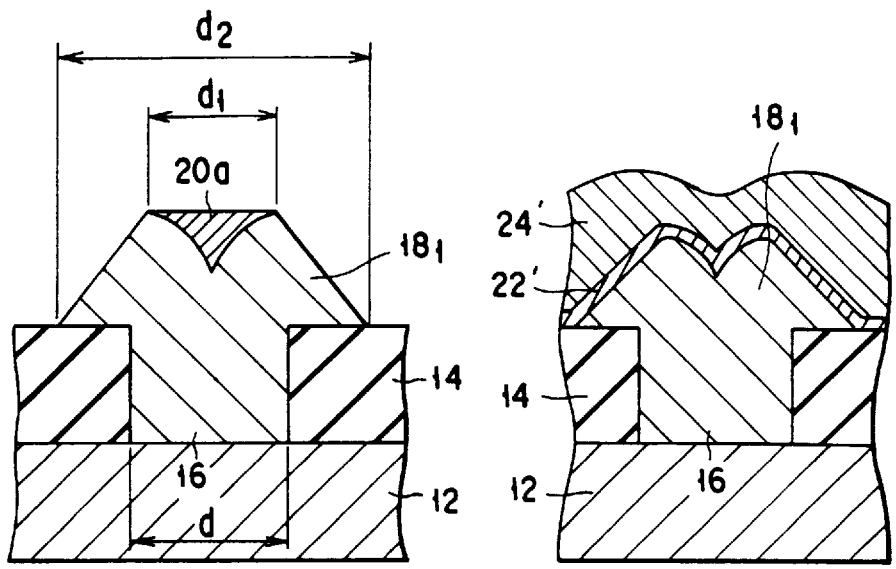
FIG. 7A is a sectional view, showing a step of manufacturing a semiconductor device according to a second embodiment of the invention.
FIG. 7B is a sectional view, showing that step of manufacturing the semiconductor device of the second embodiment of the invention, which is executed after the step of FIG. 7A.
Figure 7C:
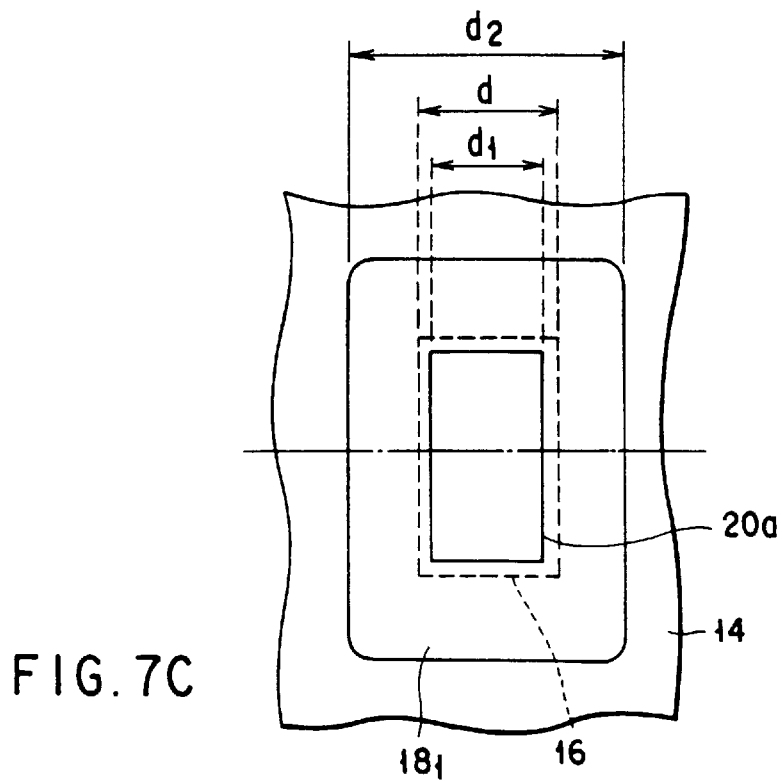
FIG. 7C is a plan view of the FIG. 7A structure.

FIGS. 7A and 7B are sectional views of the second embodiment of the invention, while FIG. 7C is a plan view of the FIG. 7A structure.

The second embodiment differs from the first embodiment in that its conductor 18 is tapered by etching after a step as shown in FIG. 4D.

In this case, each side of the surface of a remaining portion 20a of a film such as a silicon nitride film formed on a conductor $18_1$ is set shorter than a corresponding side of the opening 16. The length d1 of the remaining portion 20a is set shorter than the width d of the opening 16, and the maximum width $d_2$ of the tapered conductor $18_1$ is set greater than the length $d_1$ of the remaining portion 20a and the width d of the opening 16 (i.e. $d_1<d<d_2$).

Even where the remaining portion 20a is formed smaller than the opening 16 by taping the conductor $18_1$ on the interlayer insulating film 14, it is less possible than in the first embodiment that a dielectric formed in a later step but not shown will fall into the opening 16.

Although in the second embodiment shown in FIGS. 7A–7C, the dimensions (d), ($d_1$) and ($d_2$) of the opening 16, the remaining portion 20 and the dielectric $18_1$ have the relationship ($d_1<d<d_2$), the invention is not limited to this. The dimension of the remaining portion 20a may be larger ($d<d_1<d_2$) or smaller (($d_1<d<d_2$) than that of the opening 16. It suffices if the maximum width $d_2$ of the conductor $18_1$ is greater than the width d of the opening 16. These relationship can be realized by changing the tapering angle.

In the second embodiment, the surface area of the lower electrode is larger, because of the tapered portion, than in the first embodiment (the FIG. 4E structure). Accordingly, a greater capacitance can be imparted to the capacitor.

Furthermore, since the conductor $18_1$ is tapered, a dielectric 22' and an upper electrode 24' can be formed easily.

Figure 8A:
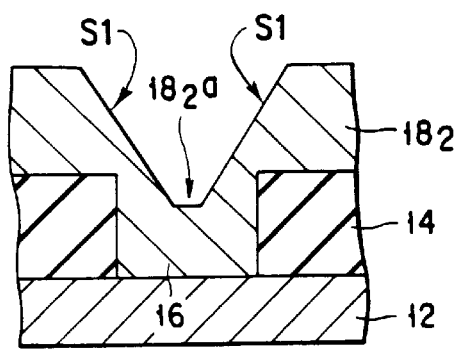
FIG. 8A is a sectional view, showing a step of manufacturing a semiconductor device according to a third embodiment of the invention.
Figure 8B:
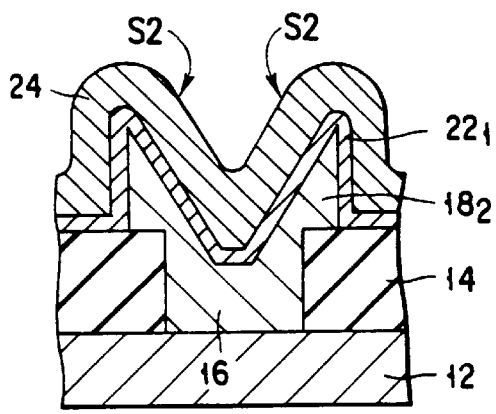
FIG. 8B is a sectional view, showing that step of manufacturing the semiconductor device of the third embodiment of the invention, which is executed after the step of FIG. 8A.
Figure 9:
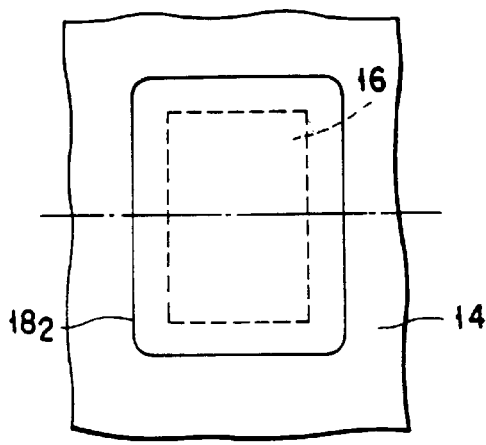
FIG. 9 is a plan view of a structure obtained by omitting part of the semiconductor device shown in FIG. 8B.

Referring then to FIGS. 8A and 8B and FIG. 9, a third embodiment of the invention will be described.

FIGS. 8A and 8B are sectional views of the third embodiment, while FIG. 9 is a sectional view of the FIG. 8B structure. FIG. 9 does not show a dielectric 221 and a conductor 24 appearing in FIG. 8B to facilitate the explanation.

The third embodiment differs from the first embodiment in that HDP (High Density Plasma) is used to deposit its conductor in a stage as shown in FIG. 4B.

When, for example, LPCVD is used, a non-tapered conductor is deposited. On the other hand, when HDP is used, a conductor $18_2$ can have tapered portions above the opening as shown in FIG. 8A. Thus, the contact area of the conductor $18_2$ and a dielectric $22_1$, which is larger than that of the conductor 18 and the dielectric 22 in the first embodiment, can be easily formed.

In the HDP method, deposition and etching can be performed simultaneously by diluting a reactive gas with $Ar^+$ and controlling the mixture by source and bias powers. The rate of the deposition or the etching depends upon the angle of a portion on the wafer. Where a portion above the opening is tapered and has an angle (e.g. 45°) as shown in FIG. 8A, the aforementioned simultaneous deposition and etching provide a most excellent result. Since the HDP method enhances the effect of the simultaneous treatment, a structure with a tapered surface above the opening can be obtained by the HDP method.

Thereafter, the process is advanced in the same manner as in the first embodiment, thereby forming a capacitor which has a lower electrode with a larger surface area than in the FIG. 4F structure, as is shown in FIG. 8B. In other words, since the contact area of the conductor $18_2$ and the dielectric $22_1$ can be made larger than that of the conductor 18 and the dielectric 22 in the first embodiment, the dielectric $22_1$ can be made to have a larger area than the dielectric 22 shown in FIG. 4F.

Although the third embodiment employs the HDP method to deposit a conductor, the usual plasma CVD method may be used instead of the HDP method. This is because when the usual plasma CVD method is employed, a conductor is deposited into an opening in an overhang manner, and hence the depressed portion can have a larger surface area than in the case of using the LPCVD method.

A fourth embodiment of the invention will be described.

Figure 10A:
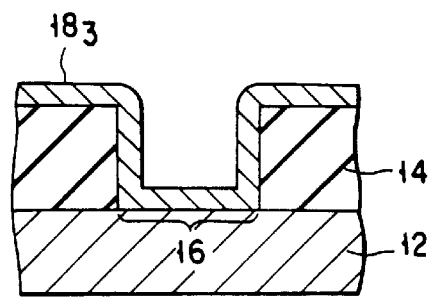
FIG. 10A is a sectional view, showing a step of manufacturing a semiconductor device according to a fourth embodiment of the invention.
Figure 10B:
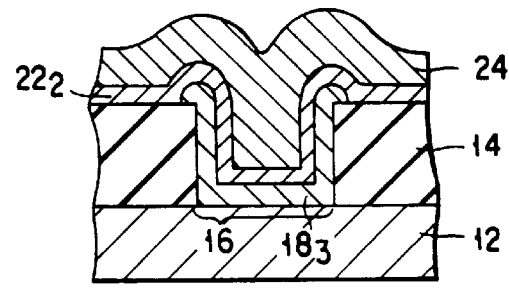
FIG. 10B is a sectional view, showing that step of manufacturing the semiconductor device of the fourth embodiment of the invention, which is executed after the step of FIG. 10A.
Figure 11:
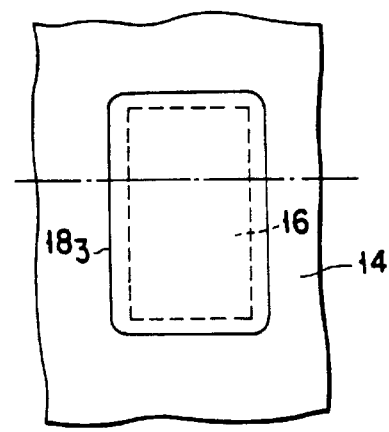
FIG. 11 is a plan view of a structure obtained by omitting part of the semiconductor device shown in FIG. 10B.

FIGS. 10A and 10B are sectional views of the fourth embodiment, while FIG. 11 is a plan view of the FIG. 10B structure. FIG. 11 does not show a dielectric $22_2$ and a conductor 24 appearing in FIG. 10B to facilitate the explanation.

The fourth embodiment differs from the first embodiment in that its conductor 18 is deposited so that the opening 16 will not completely be filled with it.

As is shown in FIG. 10A, an interlayer insulating film 14 with an opening 16 is formed on a conductor 12, and then a conductor $18_3$ is deposited on the interlayer insulating film 14 and the exposed portion of the conductor 12. In this case, however, the conductor $18_3$ is deposited to a thickness which is not sufficient to fill the opening 16.

Thereafter, the process is advanced in the same manner as in the second embodiment, thereby forming a conductor $18_3$ as shown in FIG. 10B. Then, the dielectric $22_2$ and the conductor 24 are formed on the interlayer insulating film 14 and the conductor $18_3$, thereby providing a capacitor.

Thus, in the fourth embodiment, a capacitor layer is also deposited on the side walls of the interlayer insulating film 14 which define the opening. Accordingly, even when the opening 16 has a small diameter, if the contact has a high aspect ratio, the capacitor can have a large capacitance.

Moreover, in the fourth embodiment, the conductor $18_3$ is formed thin, and hence the distance between an edge of the opening 16 and a corresponding one end of a lower electrode formed of the conductor $18_3$ can be minimized without degrading the controllability of the semiconductor device. Accordingly, capacitors can be integrated at a higher density than in the first embodiment, which means that the above-described technique is more effective when it is applied to a case where a highly integrated fine structure such as a memory cell array must be formed.

A fifth embodiment of the invention will be described.

Figure 12A:
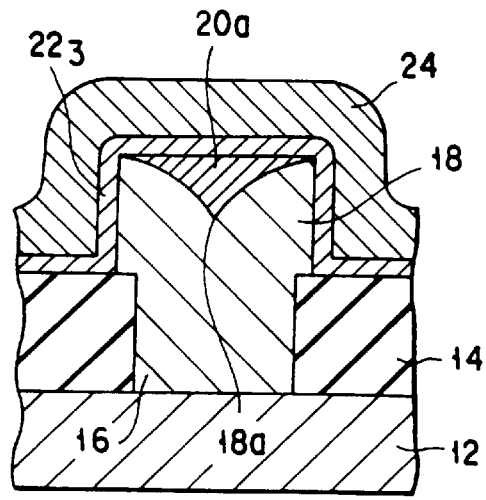
FIG. 12A is a sectional view, showing a step of manufacturing a semiconductor device according to a fifth embodiment of the invention.
Figure 12B:
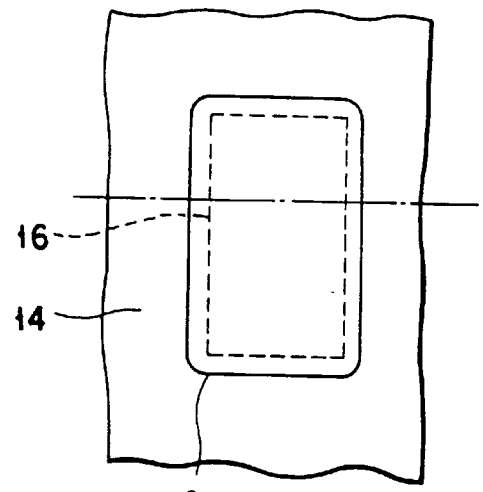
FIG. 12B is a plan view of a structure obtained by omitting part of the semiconductor device shown in FIG. 12A.

FIG. 12A is a sectional view of the fifth embodiment, while FIG. 12B is a plan view of the FIG. 12A structure. FIG. 12B does not show a dielectric $22_3$ and a conductor 24 appearing in FIG. 12A to facilitate the explanation.

The fifth embodiment differs from the first embodiment in that its film 20 is formed of a conductor, and a remaining port ion 20a of the film 20 is made to remain in the depression 18a of its conductor 18 after the FIG. 4E step, as is shown in FIG. 12A. Then, the dielectric $22_3$ is deposited on the conductor 18 with the remaining portion 20a and on the interlayer insulating film 14, thereby forming an MIM capacitor.

In the first embodiment, it is possible that those portions of the dielectric 22 which are located at the bottom of the depression 18a and indicated by $P_1$ and $P_2$ in FIG. 4F will be thinner than any other portions, and hence that the leak current of the MIM capacitor will increase or the breakdown voltage of the capacitor will be degraded. On the other hand, in the fifth embodiment, the depression 18a is filled with the remaining portion 20a of the film 20 to be flattened, and accordingly, the possibility of increase of the leak current is low.

In addition, since the remaining portion 20a is not removed, the number of the required process steps is smaller than in the conventional case.

Figure 13A:
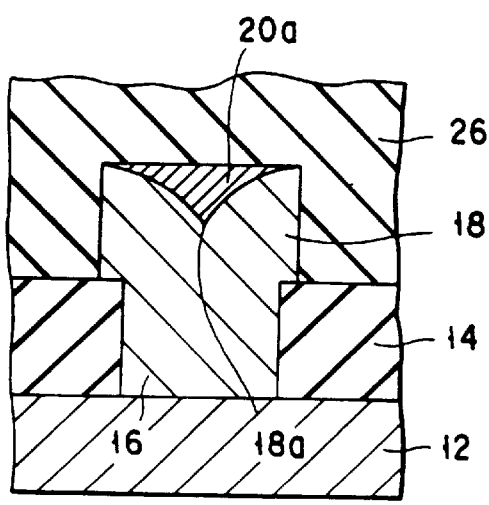
FIG. 13A is a sectional view, showing a step of manufacturing a semiconductor device according to a sixth embodiment of the invention.
Figure 13B:
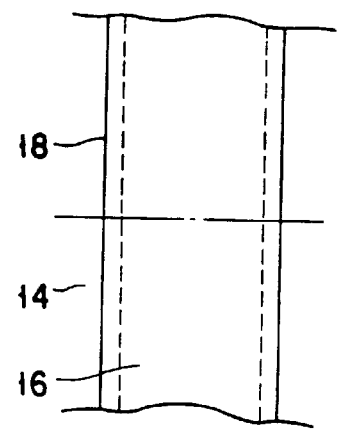
FIG. 13B is a plan view of a structure obtained by omitting part of the semiconductor device shown in FIG. 13A.

Referring then to FIGS. 13A and 13B, a sixth embodiment of the invention will be described.

First, in a step after the FIG. 4E step, the remaining portion 20a of the film 20 is kept as it is, and then an insulating film 26 is deposited on the conductor 18 with the remaining portion 20a and on the interlayer insulating film 14 as shown in FIG. 13A.

In this case, for example, the opening 16 has a linear pattern, the films 18 and 20 are formed of conductors, and the remaining portion 20a of the film 20 is also used as a wiring layer. Therefore, it is not necessary to remove the remaining portion 20a of the film 20.

Since in this case, the wiring layer is formed in a self-alignment manner with respect to a contact pattern for connecting the layer to its lower layer as in the first embodiment, there will be no misalignment of the wiring layer and the contact pattern for the lower layer, with the result that the process precision of the wiring layer will significantly increase.

Moreover, since the distance between each pair of adjacent wiring layers, when plural wiring layers are formed adjacent to each other, can be reduced to a value lower than the minimum value achieved in lithography, this technique is especially useful in a case where highly integrated fine wiring layers must be formed.

In addition, the wiring layers are not formed by lithography, which contributes to reduction of the number of required process steps.

Referring then to FIGS. 14–20, a seventh embodiment of the invention will be described.

Figure 14:
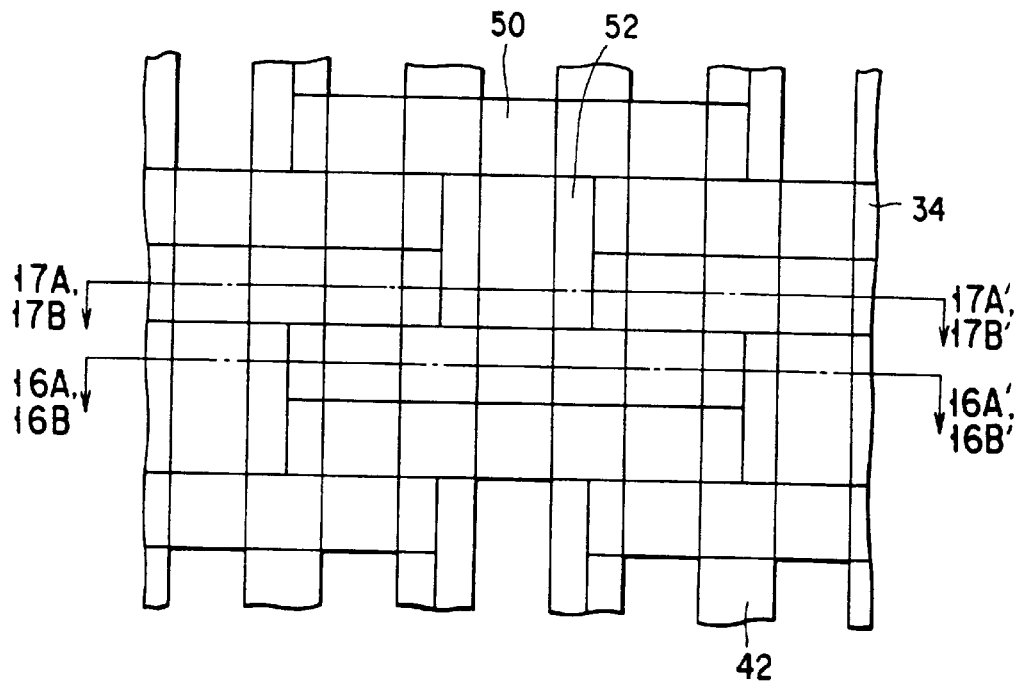
FIG. 14 is a plan view, showing that structure of a semiconductor device of a seventh embodiment, which is formed in an initial stage.
Figure 15:
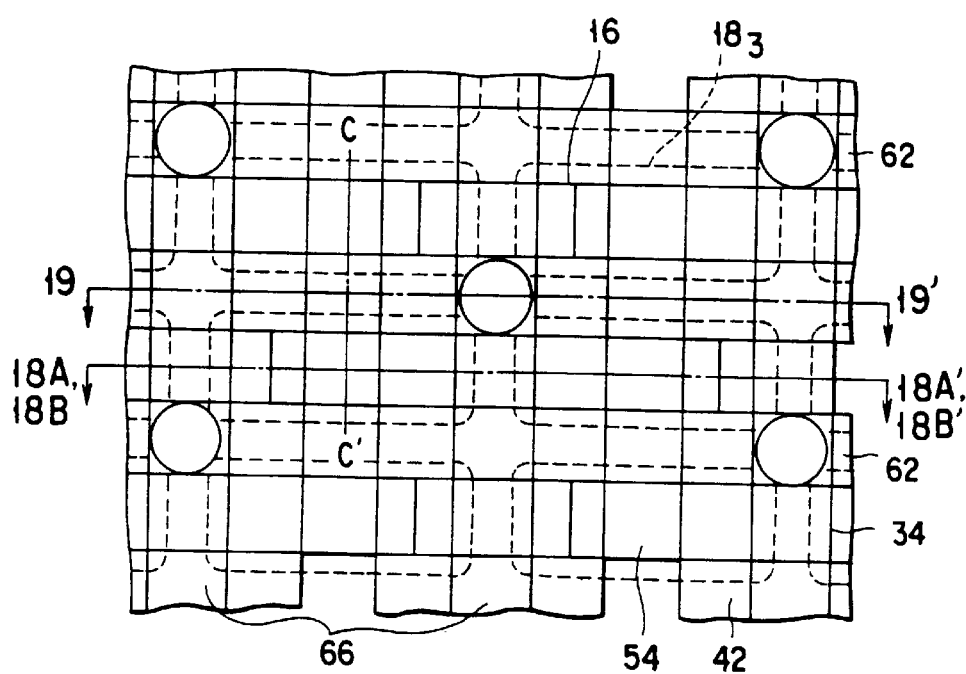
FIG. 15 is a plan view, showing that structure of the semiconductor device of the seventh embodiment, which is formed in a later stage.
Figure 16A:
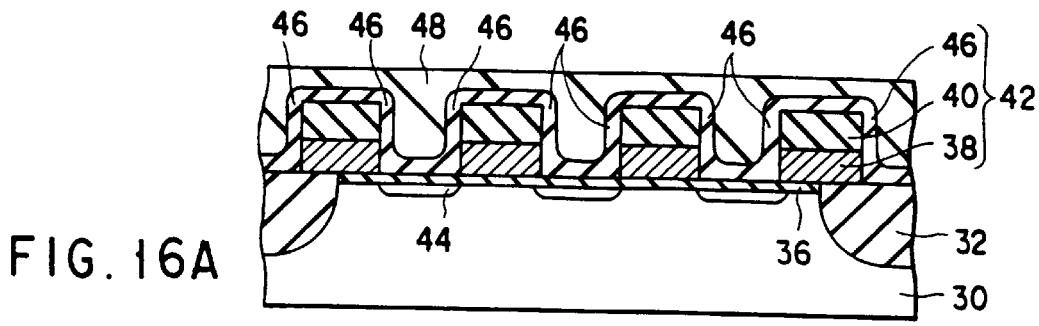
FIG. 16A is a sectional view, taken along lines A-A' of FIG. 14.
Figure 16B:
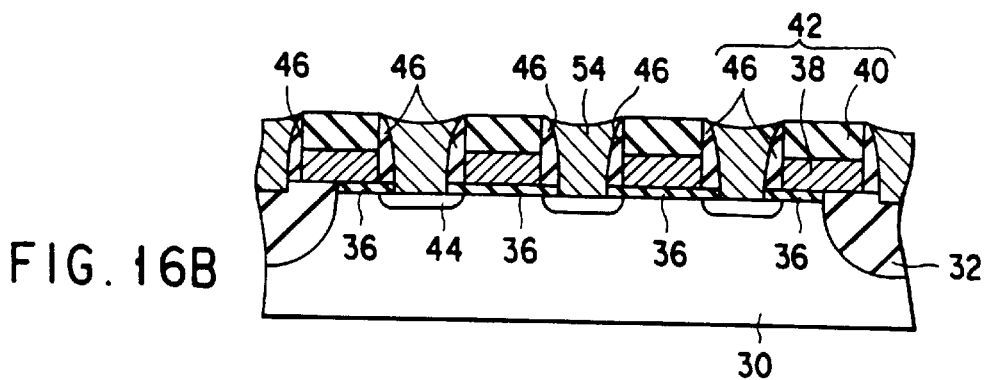
FIG. 16B is a sectional view, taken along lines B-B' of FIG. 14.
Figure 18A:
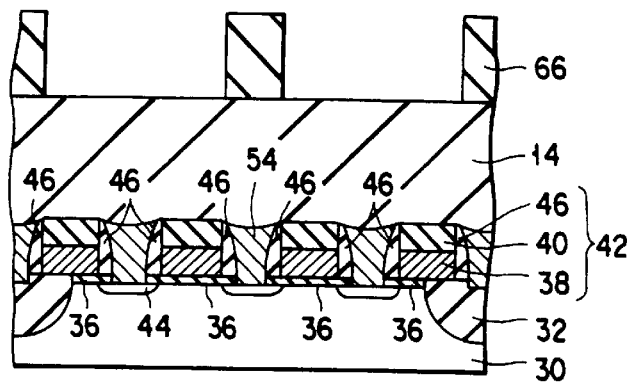
FIG. 18A is a sectional view, taken along lines A-A' of FIG. 15.
Figure 18B:
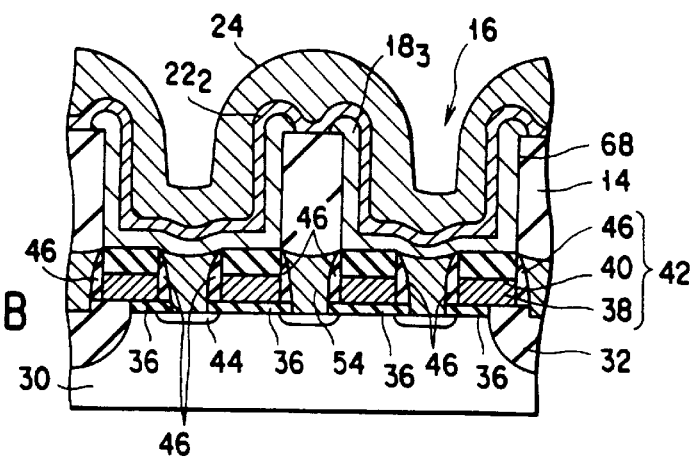
FIG. 18B is a sectional view, taken along lines B-B' of FIG. 15.
Figure 19:
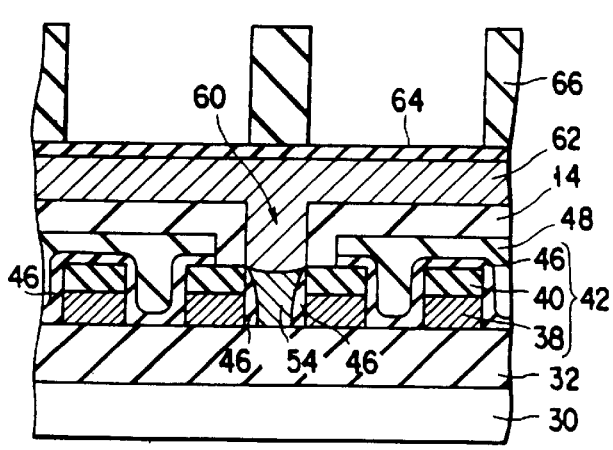
FIG. 19 is a sectional view, taken along lines 19-19' of FIG. 15.
Figure 20:
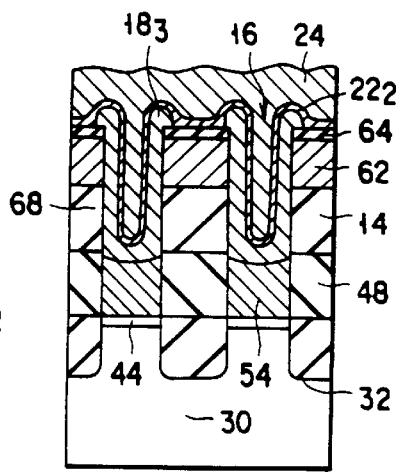
FIG. 20 is a sectional view, taken along lines C-C' of FIG. 15.

FIG. 14 is a plan view, showing that structure of a semiconductor device of a seventh embodiment, which is formed in an initial stage, and FIG. 15 is a plan view, showing that structure of the semiconductor device of the seventh embodiment, which is formed in a later stage. FIGS. 16A and 16B are sectional views, taken along lines A-A' and B-B' of FIG. 14, FIGS. 17A and 17B are sectional views, taken along lines A-A' and B-B' of FIG. 14, FIGS. 18A and 18B are sectional views, taken along lines A-A' and B-B' of FIG. 15, FIG. 19 is a sectional view, taken along lines 19-19' of FIG. 15, and FIG. 20 is a sectional view, taken along lines C-C' of FIG. 15.

In the seventh embodiment, the structure of the fourth embodiment is applied to a ½-pitch stacked DRAM cell.

The process for forming a semiconductor of the seventh embodiment will be described in order.

Figure 17A:
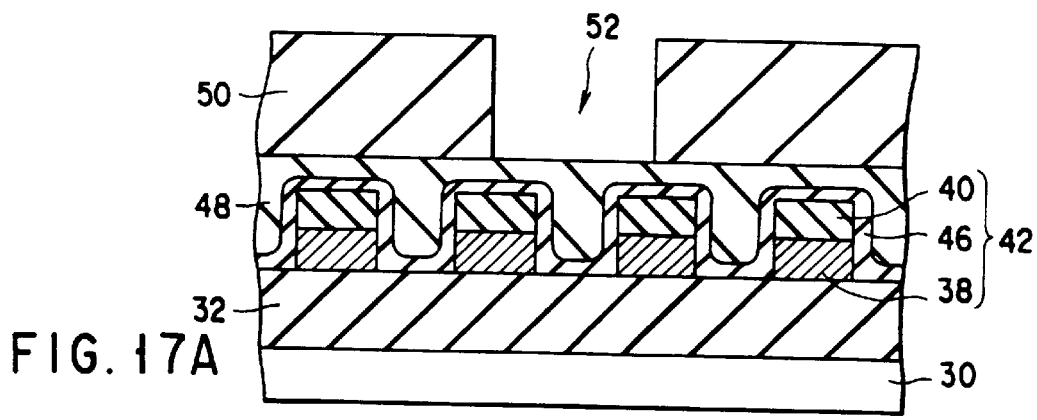
FIG. 17A is a sectional view, taken along lines A-A' of FIG. 14.
Figure 17B:
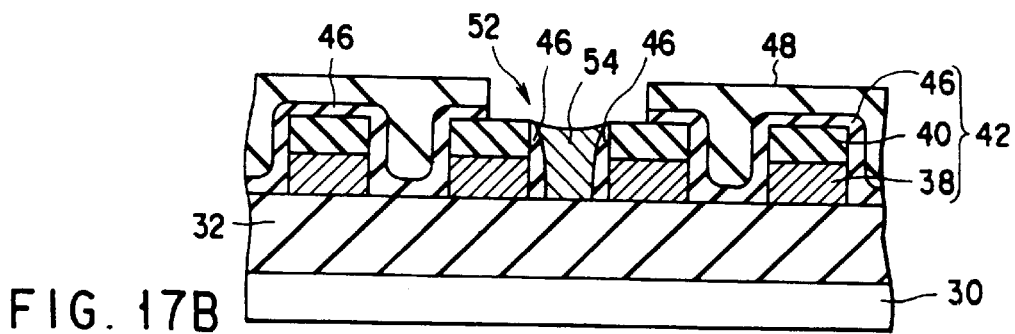
FIG. 17B is a sectional view, taken along lines B-B' of FIG. 14.

An element region 34 is formed as shown in FIG. 14 by forming an element isolating region 32 in a P-type semiconductor device 30 as shown in FIGS. 16A and 17A. Subsequently, a gate oxide film 36 is formed on the P-type substrate 30. A gate electrode 38 and a gate upper surface insulating film 40 are formed on the gate oxide film 36, in this order, thereby patterning word lines 42 as shown in FIG. 14.

Then, using the gate upper surface insulating films 40 and the element isolating region 32 as masks, N-type impurity ions (such as phosphor ions) are implanted into the substrate to form N-type diffusion layers 44. A gate side wall insulating film 46 is formed on the side surfaces of the gate electrodes 38, the side and upper surfaces of the gate upper surface insulating films 40, and the gate oxide film 36.

Subsequently, an interlayer insulating film 48 is deposited on the gate side wall insulating film 46, thereby flattening the resultant structure by, for example, CMP. A resist pattern 50 with an opening 52 for forming a plug is formed on the flattened structure.

Then, as is shown in FIGS. 16B and 17B, the gate upper surface insulating film 40, the gate side wall insulating film 46 and the interlayer insulating film 48 are etched in an anisotropic manner, using the resist pattern 50, with the selective ratios of the gate upper surface insulating film 40 and the gate side wall insulating film 46 set at high values. Subsequently, the gate side wall insulating film 46 and the gate oxide film 36 are etched in an anisotropic manner, thereby forming opening s to expose N-type diffusion layers 44 in order to form plugs 54.

Then, the resist pattern 50 is removed, and a polysilicon film doped with N-type impurity ions (e.g. arsenic ions), for example, which will constitute the plugs 54, is deposited on the resultant structure. This film is then etched to the same level as the gate upper surface insulating film 40, thereby forming the plugs 54.

Thereafter, as is shown in FIGS. 18A and 19, an interlayer insulating film 14 is deposited on the gate upper surface insulating film 40, the plugs 54 and the interlayer insulating film 48. The interlayer insulating film 14 is then etched to the same level as the plugs 54, using a resist pattern for a bit line contact as a mask. As a result, a bit line contact 60 is formed. Then, a film, which will serve as a bit line 62, and an insulating film 64 are formed, thereby providing a bit line 62. Moreover, a resist pattern 66 for storage node contacts is formed.

Subsequently, the interlayer insulating film 14 is etched in an anisotropic manner to the same level as the plugs, using the resist pattern 66 and the insulating film 64 as masks. Then, the resist pattern 66 is removed to form insulating films 68 on the side walls of the storage node contacts.

After that, the process is advanced in the same manner as in the fourth embodiment, thereby forming a conductor $18_3$, a dielectric 222 and a conductor 24 in each opening 16.

As described above, a ½-pitch stacked DRAM cell array as shown in FIGS. 15, 18B and 20 is formed.

In the seventh embodiment, capacitors can be integrated as shown in FIG. 15 for a ½-pitch stacked DRAM cell array, and the distance between each pair of adjacent capacitors can be reduced to half the value obtained when the bit and word lines are made to have minimum widths achieved in lithography. Accordingly, the capacitors can be made to have a larger area than ever.

An eighth embodiment of the invention will now be described.

Figure 21:
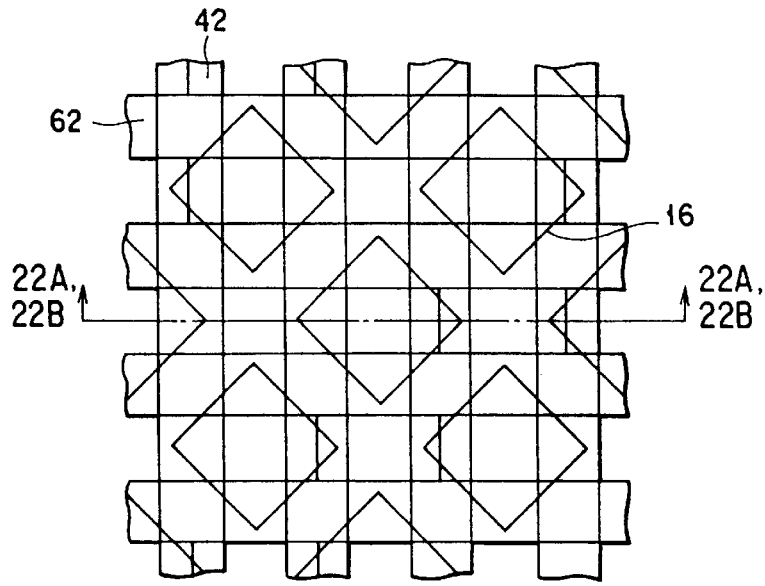
FIG. 21 is a plan view, showing a ¼-pitch stacked DRAM cell array according to an eight embodiment of the invention.
Figure 22A:
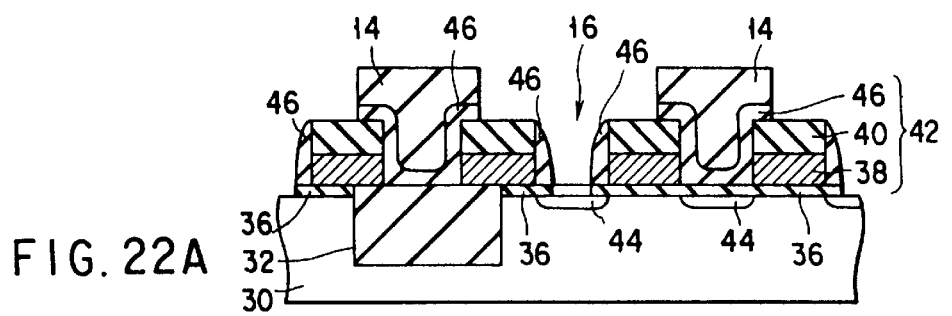
FIG. 22A is a sectional view, showing a process step of manufacturing the DRAM cell of FIG. 21.
Figure 22B:
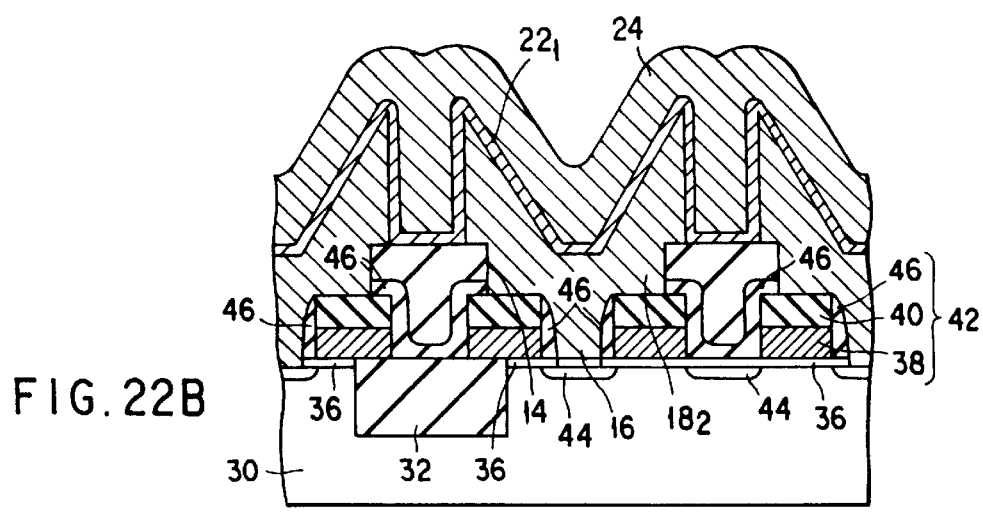
FIG. 22B is a sectional view, showing a process step of manufacturing the DRAM cell of FIG. 21.

FIG. 21 is a plan view of the eighth embodiment of the invention, and FIGS. 22A and 22B are sectional views taken along lines A-A' of FIG. 21.

The eighth embodiment is directed to a case where the structure of the third embodiment is applied to a ¼-pitch stacked DRAM cell array.

First, a bit line layer is formed on a P-type semiconductor substrate 30 as disclosed on page 17 of "Symposium on VLSI Technology" (1990) written by Y. Kohyama, et al. Then, an element isolating region 32 and a word line layer 42 are formed as in the seventh embodiment, and further, a gate side wall insulting film 46 is formed. An interlayer insulating film 14 is deposited on the gate side wall insulating film 46 and then flattened.

Thereafter, as is shown in FIG. 22A, the interlayer insulating film 14 is etched in an anisotropic manner using lithography, and then the gate side wall insulating film 46 and the gate insulating film 36 are etched in an anisotropic manner, thereby forming an opening 16 for a storage node contact. Subsequently, the process is advanced in the same manner as in the third embodiment, whereby a conductor $18_2$, a dielectric $22_1$ and a conductor 24 are sequentially formed as shown in FIGS. 21 and 22B. Thus, each cell of a ¼-pitch stacked DRAM cell array is formed.

In the eighth embodiment, capacitors can be integrated as shown in FIG. 21 for a ¼-pitch stacked DRAM cell array, and the distance between each pair of adjacent capacitors can be reduced to half the value obtained when the bit and word lines are made to have minimum widths achieved in lithography, as in the seventh embodiment. Accordingly, the capacitors can be made to have a larger area than ever.

In the above-described embodiments, the conductor 12 may consist of a semiconductor substrate, polysilicon, amorphous silicon or a metal such as tungsten. Similarly, the conductors 18, $18_1$–$18_3$ and 24 may consist of polysilicon, amorphous silicon or a metal such as tungsten.

Further, the dielectrics 22, $22_1$–$22_3$ may be formed of an oxide film or a nitride film of the conductors 18, $18_1$–$18_3$, a silicon nitride film, any combination of those films, or a metallic oxide film such as a TiO (titanium oxide) film or a BSTO (barium strontium titanium oxide) film.

Moreover, the film 20 is formed of a material which shows a high selective ratio with respect to the conductors 18, $18_1$–$18_3$ when it is etched or polished to the same level as the upper surface of each of the conductors 18, $18_1$–$18_3$, and also which is hard to etch when the conductors are etched to the same level as the upper surface of the interlayer insulating film 14. In the latter case, if the interlayer insulating film 14 is made of a silicon oxide film and the conductors 18, $18_1$–$18_3$ are made of polysilicon, the film 20 is formed of, for example, a silicon nitride film.

Although in the above description, the semiconductor substrate 30 is of the P type, it may be of the N type. When an N-type semiconductor substrate is used, the diffusion layer 44 and a film, which constitutes the plug 54, are formed of a P-type diffusion layer doped with P-type impurity ions (e.g. boron) and polysilicon doped with P-type impurity ions (e.g. boron), respectively.

In addition, although in the embodiments, the opening formed in the interlayer insulating film has a square section, it may have a circular one.

If in the conventional capacitor, an electric field may well concentrate at each corner of the dielectric interposed between the lower and upper electrodes, resulting in breakage of the capacitor. On the other hand, in the invention, the corners of the dielectric can be rounded and hence concentration of an electric field at the corners can be avoided.

As described above, in the invention, it is not necessary to use lithography to process wiring or a lower electrode incorporated in a stacked capacitor. Accordingly, the device of the invention is free from misalignment between a lower layer and the wiring or the lower electrode pattern due to the opening which is formed in a layer interposed therebetween. This means that the process precision can be increased significantly. Further, since the lithography step is not employed, the required process steps can be reduced.

Furthermore, when wiring layers or capacitors are formed adjacent to each other, the distance between each pair of adjacent ones can be reduced to a value lower than the minimum value achieved in lithography. This technique is especially useful in a case where a highly integrated fine memory cell array, for example, must be formed.

When the invention is used as a stacked capacitor, the surface area of the lower electrode can be increased by the use of the HDP deposition, the tapering etching or the thin film deposition. This technique is also advantageous as means for increasing the capacitance of the capacitor.

Additional advantages and modifications will readily occurs to those skilled in the art. Therefore, the invention in its broader aspects is not limited to the specific details and representative embodiments shown and described herein. Accordingly, various modification may be without departing from the spirit or scope of the inventive concept as defined by the appended claims and their equivalents.

I claim:

1. A semiconductor device comprising:
   a first insulating film having an opening;
   a first conductor formed on the first insulating film and in the opening, and provided with a depression formed above the opening with a bottom located in a substantially radially central portion of the opening, the depression defined at least in part by flat sloped surfaces of the first conductor sloping downward to the bottom;
   a dielectric deposited on the first conductor; and
   a second conductor deposited on the dielectric,
   wherein the dielectric has flat sloped upper surfaces extending over the flat sloped surfaces of the first conductor.

2. A semiconductor device according to claim 1, wherein the dielectric has a substantially flat bottom surface.

3. A semiconductor device according to claim 1 or 2, wherein the bottom of the depression of the first conductor exists in the opening of the first insulating film.

4. A semiconductor device according to claim 1 or 2, wherein the bottom of the depression of the first conductor exists above an upper surface of the first insulating film.

5. A semiconductor device according to claim 1 or 2, wherein the dielectric extends at a predetermined angle with respect to a bottom of the opening.

6. A semiconductor device according to claim 1 or 2, wherein the first conductor has a substantially flat bottom surface.

7. A semiconductor device according to claim 1 or 2, wherein the first conductor has slanted flat surfaces which each extend at 45° with respect to a bottom of the opening of the first insulating film.

8. A semiconductor device according to claim 1 or 2, wherein the first conductor is electrically connected to one of a source and a drain of a MOSFET, the other of the source and the drain of the MOSFET is connected to a bit line, and the first conductor, the dielectric and the second capacitor constitute a capacitor.

9. A semiconductor device according to claim 1, wherein the first conductor is electrically connected to one of the source and the drain of a MOSFET, the other of the source and the drain of the MOSFET is connected to a bit line, and the first conductor, the dielectric and the third conductor constitute a capacitor.

10. A semiconductor device according to claim 1, wherein the first conductor is electrically connected to one of the source and the drain of a MOSFET, the other of the source and the drain of the MOSFET is connected to a bit line, and the first conductor, the second conductor, the dielectric and the third conductor constitute a capacitor.

11. A semiconductor device according to claim 9 or 10, wherein the opening of the first insulating film is shaped rectangular when viewed from the above, the center of the opening is situated at the center of each pair of adjacent bit lines, the opening extending above the gate electrode of the MOSFET, above that one of the source and the drain which is electrically connected to the first conductor, and above gate electrodes adjacent to each other with the source or the drain interposed therebetween, the long side of the rectangular opening being parallel to the bit lines.

12. A semiconductor device according to claim 9 or 10, wherein the first insulating film includes a plurality of openings, the center of each of the openings being situated at the center of a junction between the first conductor and that one of the source and the drain which is electrically connected to the first conductor, each of the openings being shaped substantially rectangular and having a diagonal line perpendicular to a word line, each pair of adjacent ones of the openings being separated by a distance corresponding to the width of the gate electrode or one bit line.

* * * * *